US009679771B1

(12) United States Patent
Chen

(10) Patent No.: US 9,679,771 B1
(45) Date of Patent: Jun. 13, 2017

(54) FABRICATION AND DESIGN METHODS USING SELECTIVE ETCHING AND DUAL-MATERIAL SELF-ALIGNED MULTIPLE PATTERNING PROCESSES TO REDUCE THE CUT-HOLE PATTERNING YIELD LOSS

(71) Applicant: Peking University Shenzhen Graduate School, Shenzhen (CN)

(72) Inventor: Yijian Chen, Shenzhen (CN)

(73) Assignee: Peking University Shenzhen Graduate School, Shenzhen (CN)

( * ) Notice: Subject to any disclaimer, the term of this patent is extended or adjusted under 35 U.S.C. 154(b) by 0 days.

(21) Appl. No.: 14/998,926

(22) Filed: Mar. 7, 2016

(51) Int. Cl.
*H01L 21/331* (2006.01)
*H01L 21/033* (2006.01)

(52) U.S. Cl.
CPC ...... *H01L 21/0337* (2013.01); *H01L 21/0332* (2013.01)

(58) Field of Classification Search
CPC ............ H01L 21/0337; H01L 21/0338; H01L 21/31144; H01L 21/3086; H01L 21/32139
See application file for complete search history.

(56) References Cited

U.S. PATENT DOCUMENTS

| | | | | |
|---|---|---|---|---|
| 6,429,123 B1* | 8/2002 | Tseng | ................... | H01L 21/0337 257/68 |
| 7,611,980 B2* | 11/2009 | Wells | ................... | H01L 21/0337 257/435 |
| 8,524,605 B1* | 9/2013 | Chen | ....................... | H01L 29/00 257/E21.249 |
| 8,889,561 B2* | 11/2014 | Woo | ..................... | H01L 21/3086 257/401 |
| 8,932,955 B1* | 1/2015 | Sel | ......................... | H01L 21/308 438/694 |
| 8,969,206 B1* | 3/2015 | Sel | ....................... | H01L 21/0337 216/46 |
| 2010/0136784 A1* | 6/2010 | Mebarki | ............. | H01L 21/0337 438/669 |
| 2012/0058633 A1* | 3/2012 | Russell | ................. | G03F 7/0035 438/586 |
| 2013/0065397 A1* | 3/2013 | Chen | ................... | H01L 21/0337 438/703 |

(Continued)

OTHER PUBLICATIONS

International Technology Roadmap for Semiconductors (ITRS)—Lithography, 2013 version.

(Continued)

*Primary Examiner* — Jaehwan Oh
(74) *Attorney, Agent, or Firm* — Ladas & Parry, LLP

(57) ABSTRACT

Design and fabrication methods to reduce the effect of edge-placement errors in the cut-hole patterning process are invented using selective etching and dual-material self-aligned multiple patterning processes. The invented methods consist of a series of processing steps to decompose the original cut-hole mask into multiple separate masks, pattern the cut holes on the resist to expose certain targeted lines, and selectively etch the exposed targeted lines (formed by dual-material self-aligned multiple patterning processes) without attacking the non-target lines. This invention provides production-worthy methods for the semiconductor industry to continue IC scaling down to sub-10 nm half pitch.

37 Claims, 14 Drawing Sheets

(56) References Cited

U.S. PATENT DOCUMENTS

2015/0087149 A1* 3/2015 He ............... H01L 21/0338
                                                    438/696
2016/0049307 A1* 2/2016 Chen ............. H01L 21/0337
                                                    438/696

OTHER PUBLICATIONS

Y. Borodovsky, "Complementary Lithography at Insertion and Beyond," Semicon West 2012, Jun. 11, 2012, San Francisco, CA.

C. Bencher, Y.M. Chen, H. Dai, W. Montgomery, L. Huli, "22nm Half-Pitch Patterning by CVD Spacer Self Alignment Double Patterning (SADP)", Proc. SPIE vol. 6924, 69244E, 2008.

Y. Chen, P. Xu, L. Miao, Y.M. Chen, Xumou Xu, D. Mao, P. Blanco, C. Bencher, R. Hung, C. Ngai, "Self-aligned Triple Patterning for Continuous IC Scaling to Half-Pitch 15nm", Proc. of SPIE, col. 7973, 7973IP, 2011.

P. Xu, Y.M. Chen, Y. Chen, L. Miao, S. Sun, S-W Kim, A. Berger, D. Mao, C. Bencher, R. Hung, C. Ngai, "Sidewall spacer quadruple patterning for 15nm half-pitch," Proc. of SPIE, vol. 7973. 79731Q, 2011.

J. Yu, W. Xiao, W. Kang, Y. Chen, "Understanding the Critical Challenges of Self-Aligned Octuple Patterning," Proc. of SPIE, vol. 9052, 90521P, 2014.

P. Zhang, C. Hong, Y. Chen, "A Generalized Edge-Placement Yield Model for the Cut-Hole Patterning Process," Proc. of SPIE, vol. 9052, 90521Q, 2014.

* cited by examiner

Fig. 5C (no misalignment)

Fig. 5D (with misalignment)

Prior art.

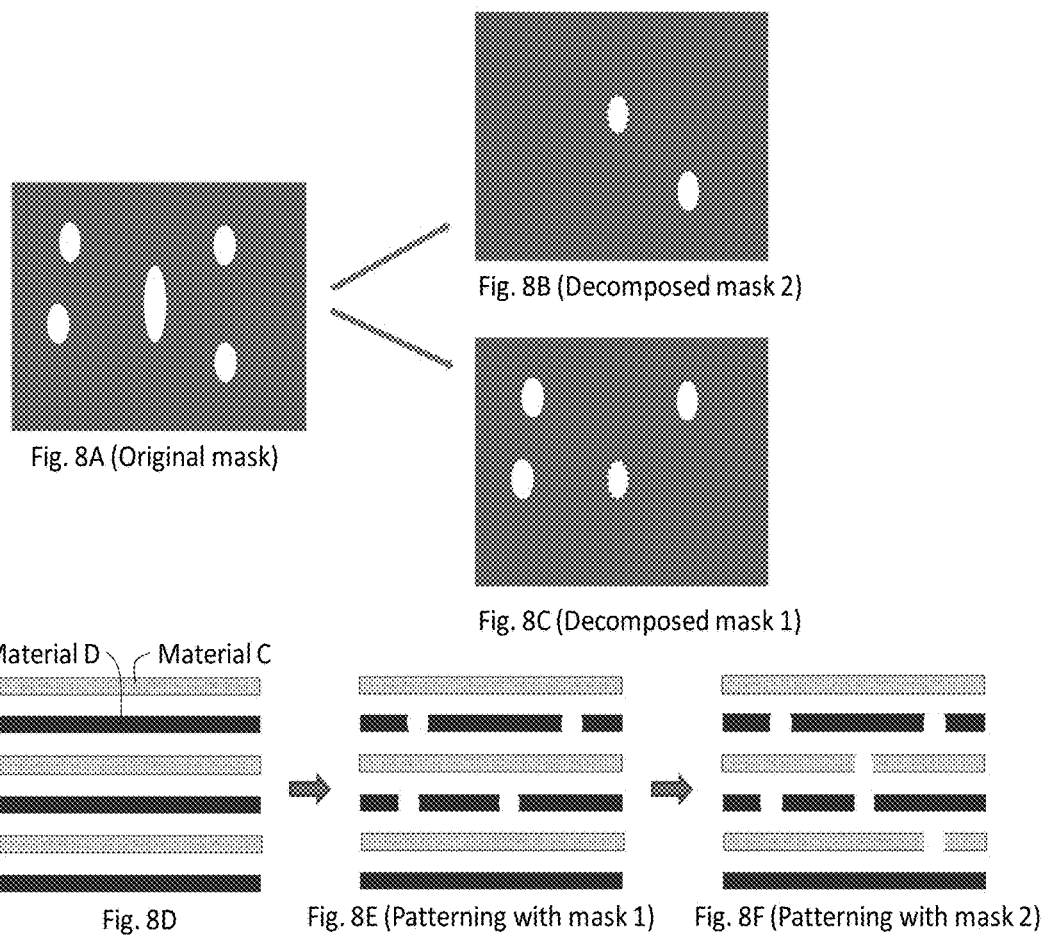

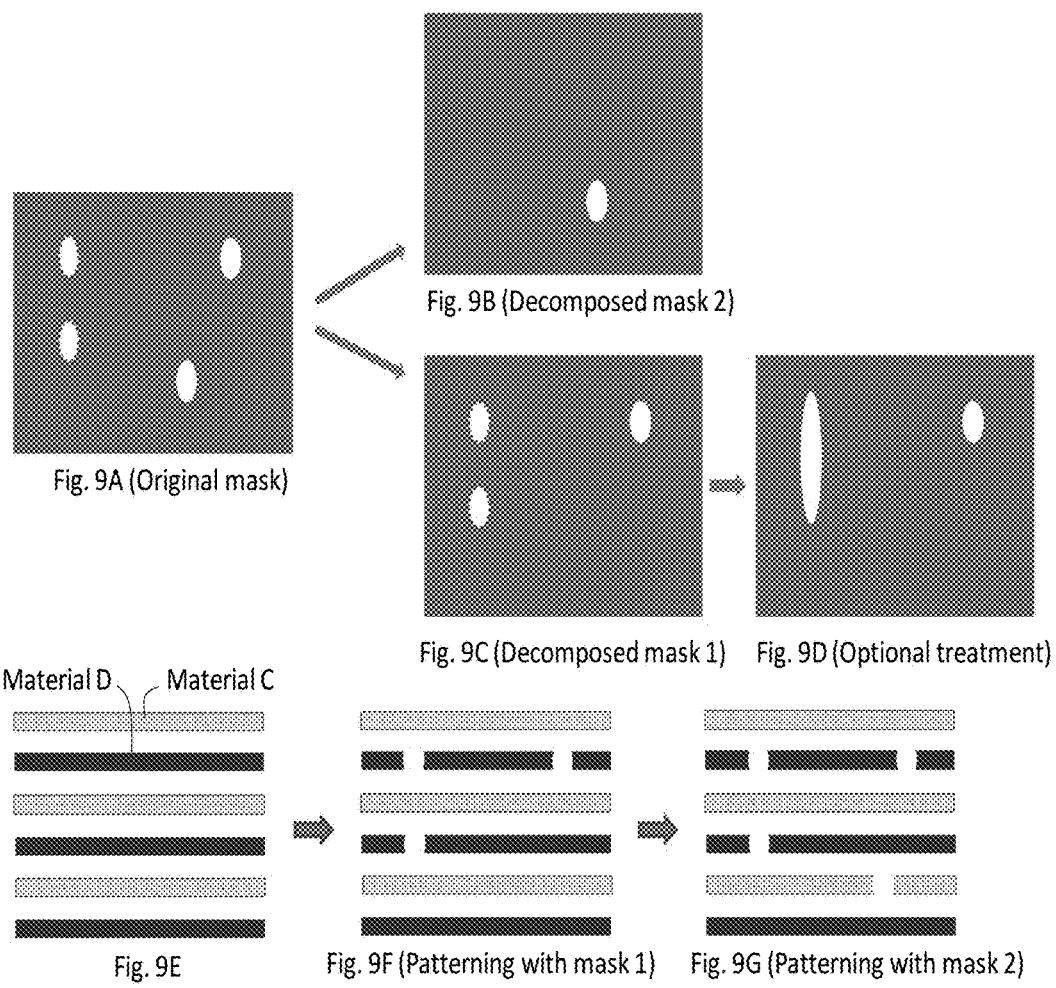

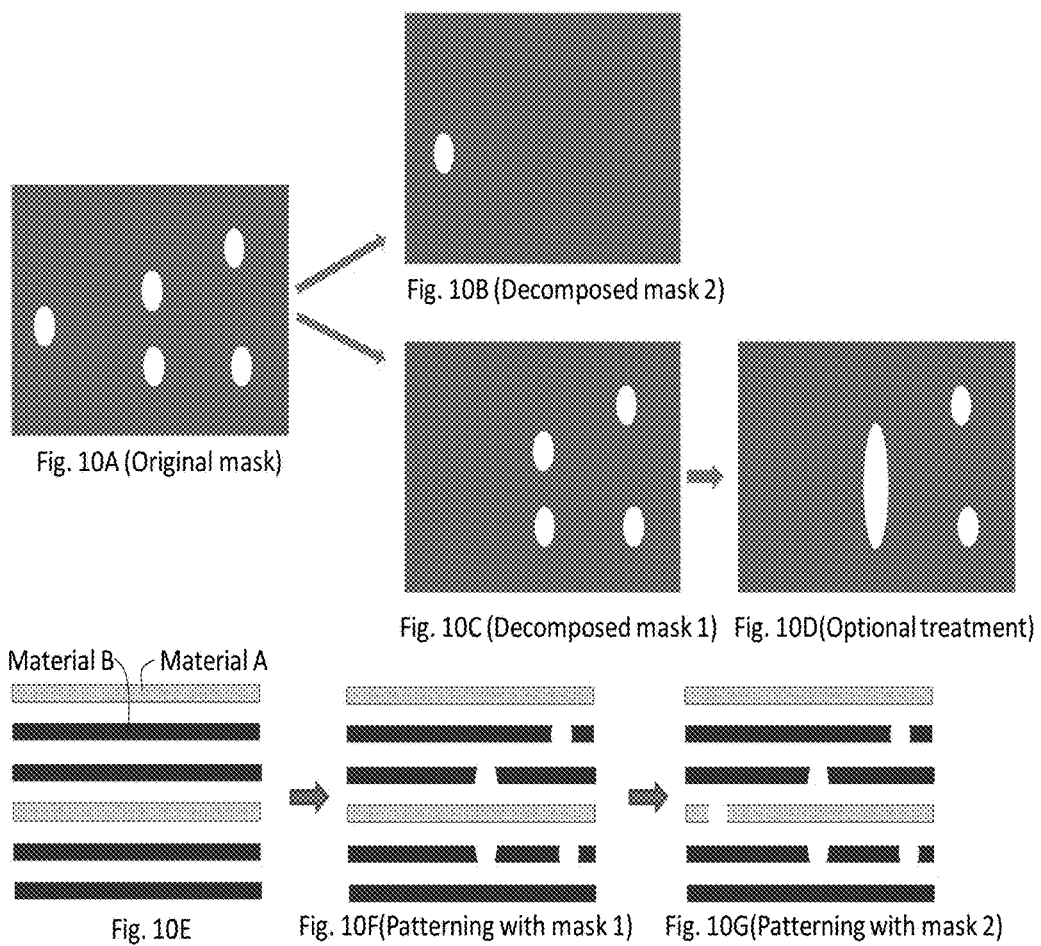

FABRICATION AND DESIGN METHODS USING SELECTIVE ETCHING AND DUAL-MATERIAL SELF-ALIGNED MULTIPLE PATTERNING PROCESSES TO REDUCE THE CUT-HOLE PATTERNING YIELD LOSS

BACKGROUND OF THE INVENTION

Due to the delay of EUV lithography, "complementary lithography" is widely considered as a promising solution for continuous IC scaling down to sub-10 nm half pitch [1]. Its patterning process starts from a line/trench fabrication step followed by a line-cut/trench-block step to form the desired 1-D high-density IC patterns [2]. Therefore, a satisfactory edge-placement accuracy of the cut holes is critical for its future success [2]. In particular, the overlay errors and critical-dimension variations presented in the cut-hole patterning process are the main yield-loss factors and there is an urgent need to develop a processing solution to improve the cut-hole patterning yield.

Spacer based self-aligned multiple patterning (SAMP [3-7]) techniques such as self-aligned double (SADP [3]), triple (SATP [4]), quadruple (SAQP [5]), sextuple (SASP [6]), and octuple (SAOP [7]) schemes, when combined with DUV immersion lithography, can potentially drive the minimum half pitch of IC features down to about 5 nm. In a SATP process as shown in FIG. 1 (prior art, [4]), small mandrel lines are patterned first using material A. After the mandrel patterning step, two consecutive spacers as shown in FIG. 1C (i.e., the sacrificial and then structural spacers) are formed on the lateral sides of the mandrel lines. The sacrificial spacers are then etched, leaving the mandrel lines (made of material A) and structural spacers (made of material B) and resulting in spatial frequency tripling. This SATP process allows us to select different materials for mandrel lines and structural spacers (e.g., A B B A B B A B B . . . as shown in FIG. 1D). Therefore, it is possible to apply a highly selective etching process to remove certain type of lines (e.g., made of material A) with negligible loss of the other lines (e.g., made of material B).

For a comparison, one SAQP process scheme reported in the literature [5] is shown in FIG. 2. It starts from a mandrel patterning step (FIG. 2B), followed by a spacer (first spacer or spacer 1) forming process (FIGS. 2C-2D) and an etching process to remove the mandrels (FIG. 2E). After the spacer 1 patterns are transferred to the underneath layer (FIG. 2F), the second spacers (or spacer 2) will be formed on the sidewalls of the transferred/sacrificial lines. These sacrificial lines are then etched and the left patterns are the second spacers made of one single material (see FIG. 2H). Unlike the line features fabricated by a dual-material SATP process, the single-material characteristic of the final SAQP line features does not accommodate a highly selective etching process (in a following step) to partially remove certain exposed lines in the array without attacking other lines that are also exposed.

The self-aligned sextuple patterning (SASP [6]) process can be considered as an extension of the SATP process except that its feature density can be twice of the SATP density. As shown in FIG. 3 (prior art, [6]), a SASP process (see FIGS. 3C-3E) defines the mandrels by the first spacers (possibly by an etching/transfer process) while the mandrels in a SATP process are printed by optical lithography. This can not only increase the feature density, but also result in better critical-dimension (CD) uniformity and line-width-roughness (LWR) performance. Two consecutive spacers (i.e., the second and third spacers) are then formed on the lateral sides of the mandrels while the second/sacrificial spacers are etched and the final line patterns consist of two types of spacers: the first-spacer defined mandrels and third spacers (as shown in FIGS. 3G-3H). The common characteristic of the SATP and SASP processes is that their final lines can be made of two different materials. As we shall describe later, such a material characteristic allows us to design a novel processing method to reduce the effect of edge-placement errors (EPE, defined as the difference between the intended and actual edge locations of holes/trenches over lines [2], [8]) when etching/cutting the exposed lines through the holes on top of them.

In a self-aligned octuple patterning (SAOP [7]) process shown in FIG. 4, three consecutive spacers are formed while the final line patterns consist of only one type of spacers: the third spacers. These spacers are made of one single material (see FIG. 4I) and consequently the SAOP and SAQP processes mentioned above (unlike the SATP or SASP processes) do not allow a selective etching process (in a following step) to partially remove certain exposed lines.

By using the complementary lithography [2], a paradigm shift in device structure and IC design from random 2-D to regular 1-D scenario has occurred recently in the semiconductor industry. As shown in FIG. 5 (prior art [2]), the high-density 1-D grating structure will be first patterned by a SAMP process (FIG. 5A) followed by EUV or other lithographic process (one or multiple exposures) to pattern the cut holes on top of the lines (FIG. 5B). After the cut-hole patterning step, a plasma etching process will be used to remove the exposed parts of the 1-D lines to form desired 1-D circuit patterns (FIG. 5C). However, one critical challenge in complementary lithography is the inaccuracy of hole-edge placement due to the overlay errors (e.g., misalignment) and hole CD variations in the patterning step. For instance, a misaligned hole (on the patterned resist layer) indicated by the dashed rectangle in FIG. 5D can expose a non-targeted line that is supposed to remain unexposed in a following etch process. As a result, this non-targeted line may be mistakenly cut apart provided that it is made of the same material as other targeted lines, thus causing a device/circuit failure due to the loss of electrical connection function. To avoid such a failure in the presence of edge-placement errors, one possible method is to use (two) different materials for the targeted and non-targeted lines and choose a highly selective etching process that can only remove the material of the targeted lines. Even the non-targeted lines may be mistakenly exposed by misaligned holes, a highly selective etching process will not attack the exposed parts (i.e., with negligible material loss) and thus can avoid completely cutting the non-targeted lines apart.

In conclusion, the previously reported single-material SAQP and SAOP processes [5] [7] suffer from the edge-placement errors. They must be modified in order to accommodate two different materials (in an alternating order) in the final patterns for solving the issue of edge-placement errors. The purpose of this patent is to report several new design and fabrication methods that allow such a dual-material type of patterning techniques to reduce the effect of inevitable edge-placement errors in an IC lithographic process.

BRIEF SUMMARY OF THE INVENTION

Embodiments of the present invention pertain to methods of designing the cut-hole layout on top of the lines (made of two different materials) fabricated by a dual-material self-aligned multiple patterning process, followed by a highly selective etching process to cut these lines into the desired shapes even in the presence of significant edge-placement errors. Based on standard semiconductor processing techniques and the invented mask design method, multiple-mask process modules are developed to pattern complicated patterns and to overcome the edge-placement-error challenges for patterning critical layers of logic and memory devices. Further applications of the present disclosure can be found in the detailed description provided hereinafter.

A number of novel dual-material self-aligned quadruple (dmSAQP hereinafter) and octuple patterning (dmSAOP hereinafter) process sequences are first developed in accordance with the invention. In such a dmSAQP process shown in FIG. 6, a CVD (chemical vapor deposition) or spin-on film is formed over the substrate and patterned to create the mandrel features. After that, nitride (or oxide) spacers are formed on the lateral sides of mandrels by depositing a nitride (or oxide) layer and etching it back to just remove the deposited material on top of the mandrel features. The mandrels are then etched by oxygen plasma which does not attack the nitride or oxide spacers. The left nitride or oxide spacers are transferred to the underneath layer by a plasma etch. These transferred lines can be used as the second mandrels for the second spacer and a following filled-in process to form the structural lines. Many material choices for the second spacer and filled-in process are possible, provided that they have high etching selectivity to each other. For example, polycrystalline or amorphous Si can be used for the second spacers while nitride or oxide can be used for the filled-in material. As a result, the final line features fabricated by this dmSAQP process are made of two different materials, as shown in FIG. 6H.

In the other dmSAOP process as shown in FIG. 7, its process sequence is quite similar to a dmSAQP process sequence except that an extra spacer step is needed and the final feature density can be increased by a factor of eight. The final line features fabricated by a dmSAOP process are also made of two different materials and its design rules to generate a cut-hole mask follow those for a dmSAQP process.

The top views of a line array fabricated by a dmSAQP process and the related cut-hole layout treatment are shown in FIGS. 8 and 9, respectively. The first treatment is to decompose those holes (exposing multiple lines made of different materials) into multiple smaller holes such that each hole exposes only one line made of one material. Moreover, all the holes collected into the same decomposed mask must only expose the lines made of the same material. This layout decomposition principle is schematically demonstrated in FIG. 8 using a layout example. It can be seen that a larger hole (exposing two lines made of different materials) in FIG. 8A is decomposed into two smaller holes (as shown in FIGS. 8B and 8C) which are then assigned into two separate masks. Each decomposed mask needs to be exposed separately to print holes on the resist (which is spun on top of the 1-D lines), followed by a selective etching process to cut the targeted lines apart without attacking the non-targeted lines, as shown in FIGS. 8D-8F. A following (optional) treatment of the holes decomposed into the same mask is to identify those small holes with the smallest pitches and merge them together to form larger holes (as illuminated by a layout example in FIG. 9). The sizes of these merged holes are larger and can improve the patterning process window and yield performance even though they will expose some non-targeted lines located between the original holes (i.e., before they are merged). However, exposure of those non-targeted lines in a highly selective etching process will not cause a serious material-loss issue.

The design rules for a cut-hole mask used in SATP and SASP processes are quite similar to those for dmSAQP and dmSAOP processes (shown in FIGS. 8 and 9) except that in the first layout treatment, a hole in SATP and SASP processes is allowed to expose two lines (rather than only one line) made of the same material. This is because SATP and SASP processes produce a different arrangement of the line material (e.g., A B B A B B A B B . . . as shown in FIG. 10) from the arrangement produced in dmSAQP and dmSAOP processes (e.g., A B A B A B . . . as shown in FIGS. 8 and 9). Moreover, a unique mandrel or/and spacer CD tuning technique (e.g., by controlling the CVD deposition time of the spacer films) can be applied to both SASP and SATP processes such that the gap between two (final) neighboring spacers made of material B (as shown in FIGS. 1 and 3) can be enlarged to tolerate more significant edge-placement errors.

It should be pointed out that the description of specific process details such as examples, materials, and film-stack designs, while indicating various embodiments, are intended for the purpose of illustration only and are not intended to limit the scope of the disclosure. To help readers quickly understand this invention, we do not include unnecessarily detailed process information in the above summary such as thin hard-stop layers that are usually required when performing the etch process to transfer the patterns from one layer to the underneath film.

BRIEF DESCRIPTION OF THE SEVERAL VIEWS OF THE DRAWING(S)

A further understanding of the invention may be realized by reference to the specification and the drawings presented below. The figures are incorporated into the detailed description portion of the invention.

Figure 1A:
FIGS. 1A-1D, represent prior art, and illustrate the cross-sectional views of a conventional self-aligned triple patterning (SATP) process [4].
Figure 1B:
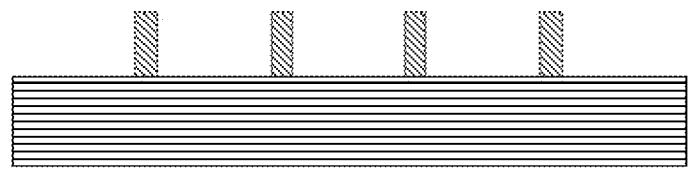
Figure 1C:
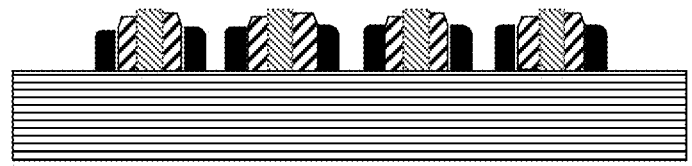
Figure 1D:
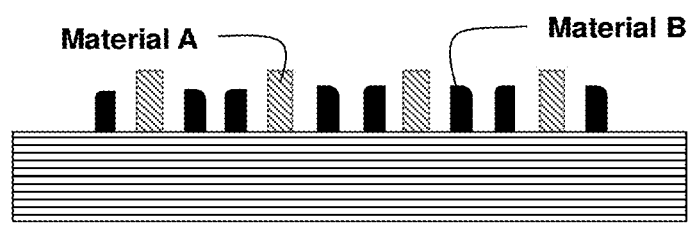
Figure 2A:
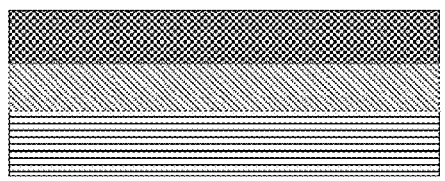
FIGS. 2A-2I, represent prior art, and illustrate the cross-sectional views of one possible scheme of the conventional self-aligned quadruple patterning (SAQP [5]) process which produces a line array made of the same material.
Figure 2B:
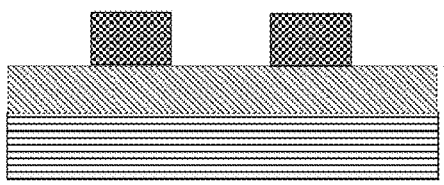
Figure 2C:
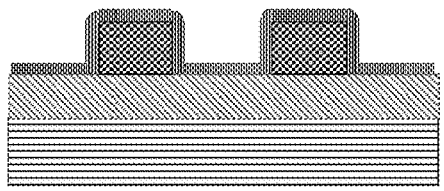
Figure 2D:
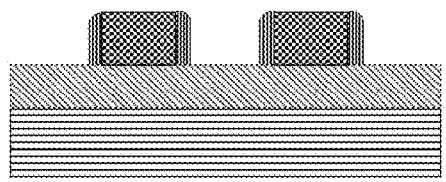
Figure 2E:
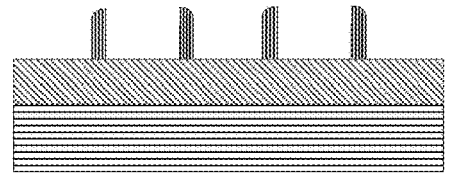
Figure 2F:
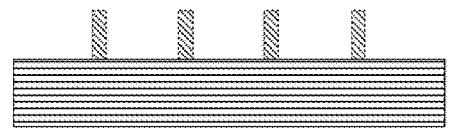
Figure 2G:
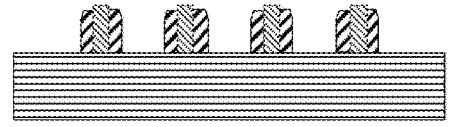
Figure 2H:
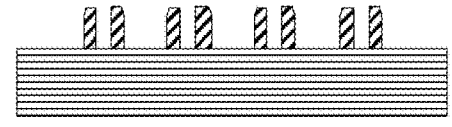
Figure 2I:
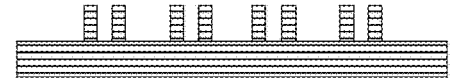
Figure 3A:
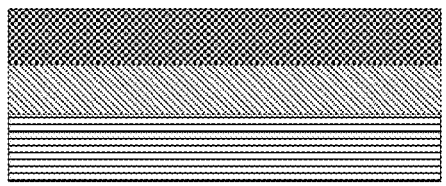
FIGS. 3A-3H, represent prior art, and illustrate the cross-sectional views of a conventional self-aligned sextuple patterning (SASP [6]) process.
Figure 3E:
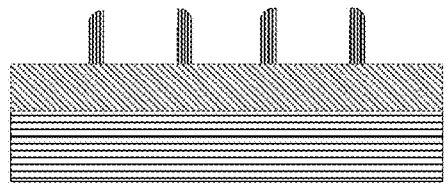
Figure 3B:
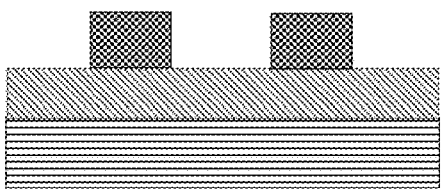
Figure 3F:
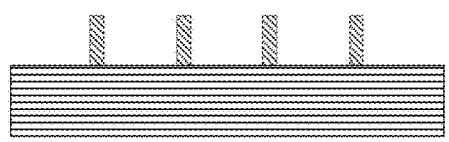
Figure 3C:
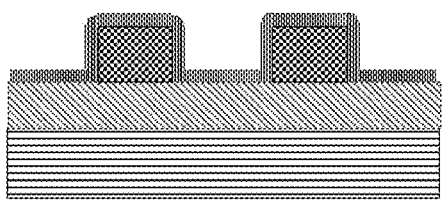
Figure 3G:
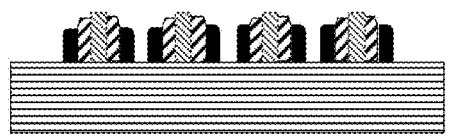
Figure 3D:
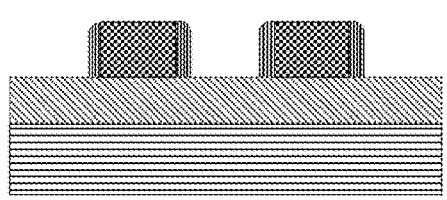
Figure 3H:
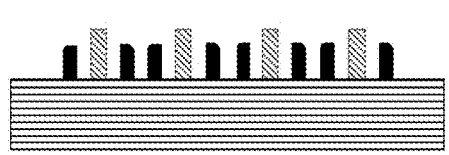
Figure 4A:
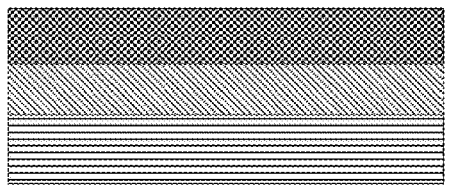
FIGS. 4A-4I, represent prior art, and illustrate the cross-sectional views of one possible scheme of the conventional self-aligned octuple patterning (SAOP [7]) process which produces a line array made of the same material.
Figure 4B:
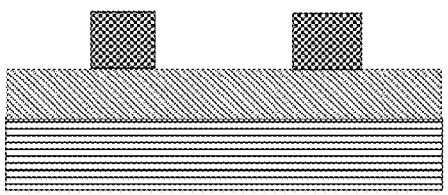
Figure 4C:
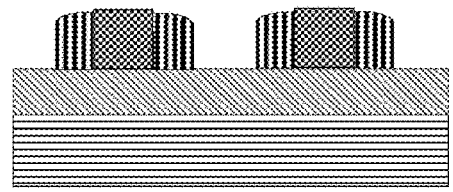
Figure 4D:
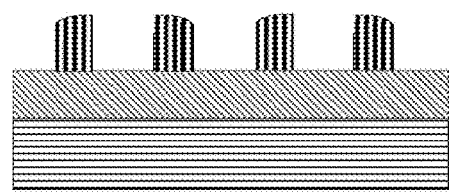
Figure 4E:
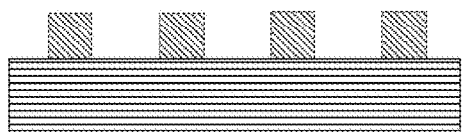
Figure 4F:
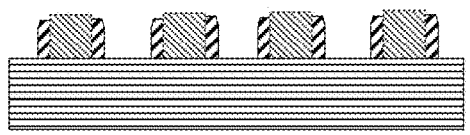
Figure 4G:
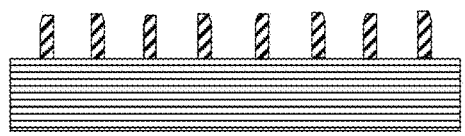
Figure 4H:
Figure 4I:
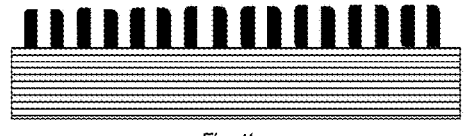
Figures 5A, 5B:
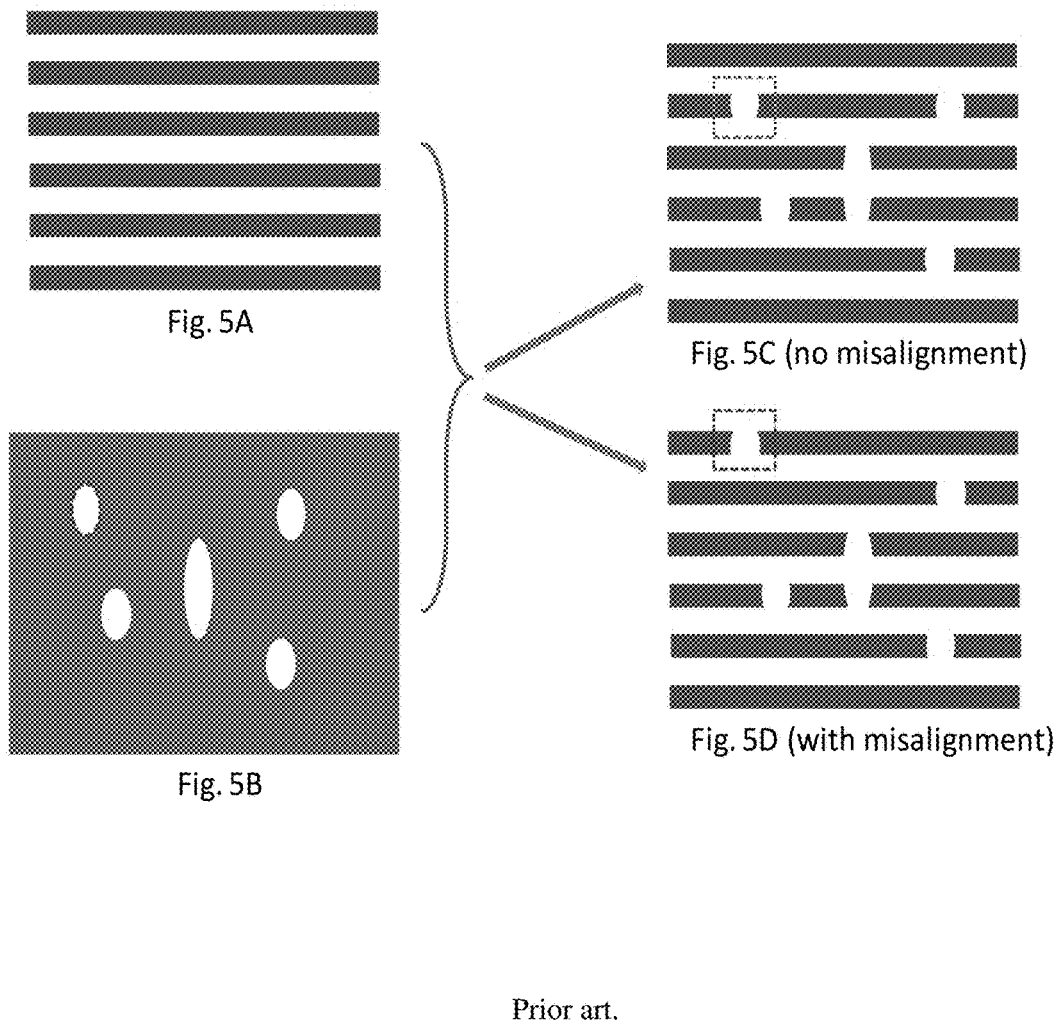

FIG. 5, a figure of representing prior art, illustrates the top views of a patterning process in the "complementary lithography [2]" wherein the dense 1-D line array is first formed by the self-aligned multiple patterning (as shown in FIG. 5A) followed by printing some cut holes on the resist (as shown in FIG. 5B, the resist is spun over the lines) and applying an etching process to cut the targeted lines apart (as shown in FIG. 5C). However, as indicated by the dashed rectangle in FIG. 5D, a misaligned hole can mistakenly expose a non-targeted line and result in a wrong cut.

FIGS. 6A-6H illustrate the cross-sectional views of a dual-material self-aligned quadruple patterning (dmSAQP) process which produces a line array made of different materials.

FIGS. 7A-7J illustrate the cross-sectional views of a dual-material self-aligned octuple patterning (dmSAOP) process which produces a line array made of different materials.

FIG. 8 illustrates the top views of a patterning process wherein the original cut-hole mask (FIG. 8A) is decomposed into two separate masks (FIGS. 8B and 8C) which will be exposed separately to pattern holes (on the resist) over the 1-D line array formed by a dmSAQP or dmSAOP process as shown in FIG. 8D. Each cut-hole patterning process will expose only those lines made of the same material, followed by a selective etching process to cut the targeted lines apart without attacking the non-targeted lines, as shown in FIGS. 8E-8F.

FIGS. 9A-9G illustrate the top views of a patterning process wherein the original cut-hole mask (FIG. 9A) is decomposed into two separate masks (FIGS. 9B and 9C). Some small holes with the smallest pitches on each decomposed mask (e.g., mask 1) can be merged together to form larger holes (FIG. 9D) to improve the patterning process window. The decomposed masks will be exposed separately to pattern holes (on the resist) over the 1-D line array formed by a dmSAQP or dmSAOP process as shown in FIG. 9E. Although the merged holes may expose some lines made of a different material, a highly selective etching process will only cut the targeted lines apart without attacking the non-targeted lines, as shown in FIG. 9F.

FIG. 10 illustrates the top views of a patterning process wherein the original cut-hole mask (FIG. 10A) is decomposed into two separate masks (FIGS. 10B and 10C) which will be exposed separately to pattern holes (on the resist) over the 1-D line array formed by an SATP or SASP process as shown in FIGS. 10E-10G. Some small holes with the smallest pitches on each decomposed mask (e.g., mask 1) can be merged together to form larger holes to improve the patterning process window, as shown in FIG. 10D.

Figure 11:
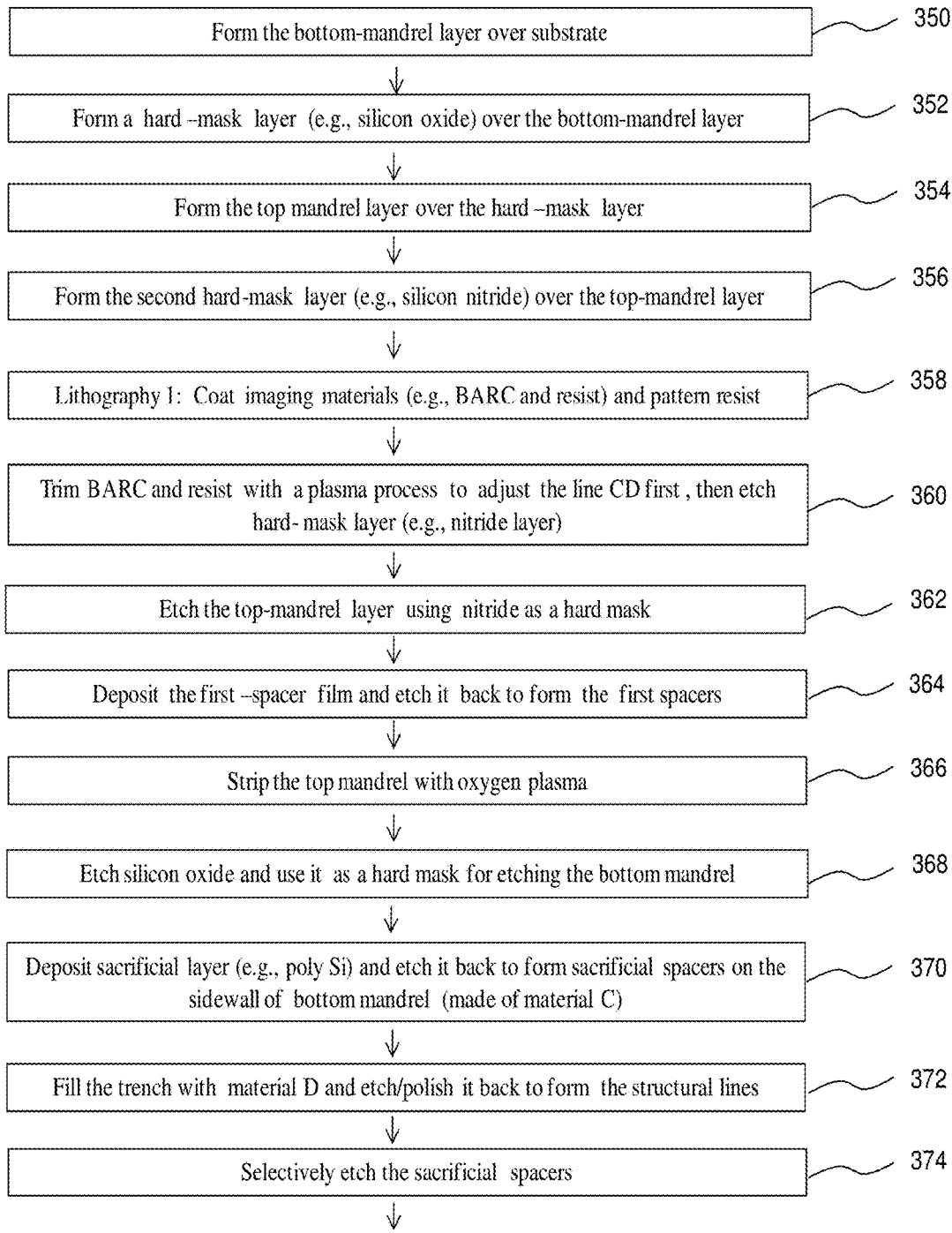
Figure 11:
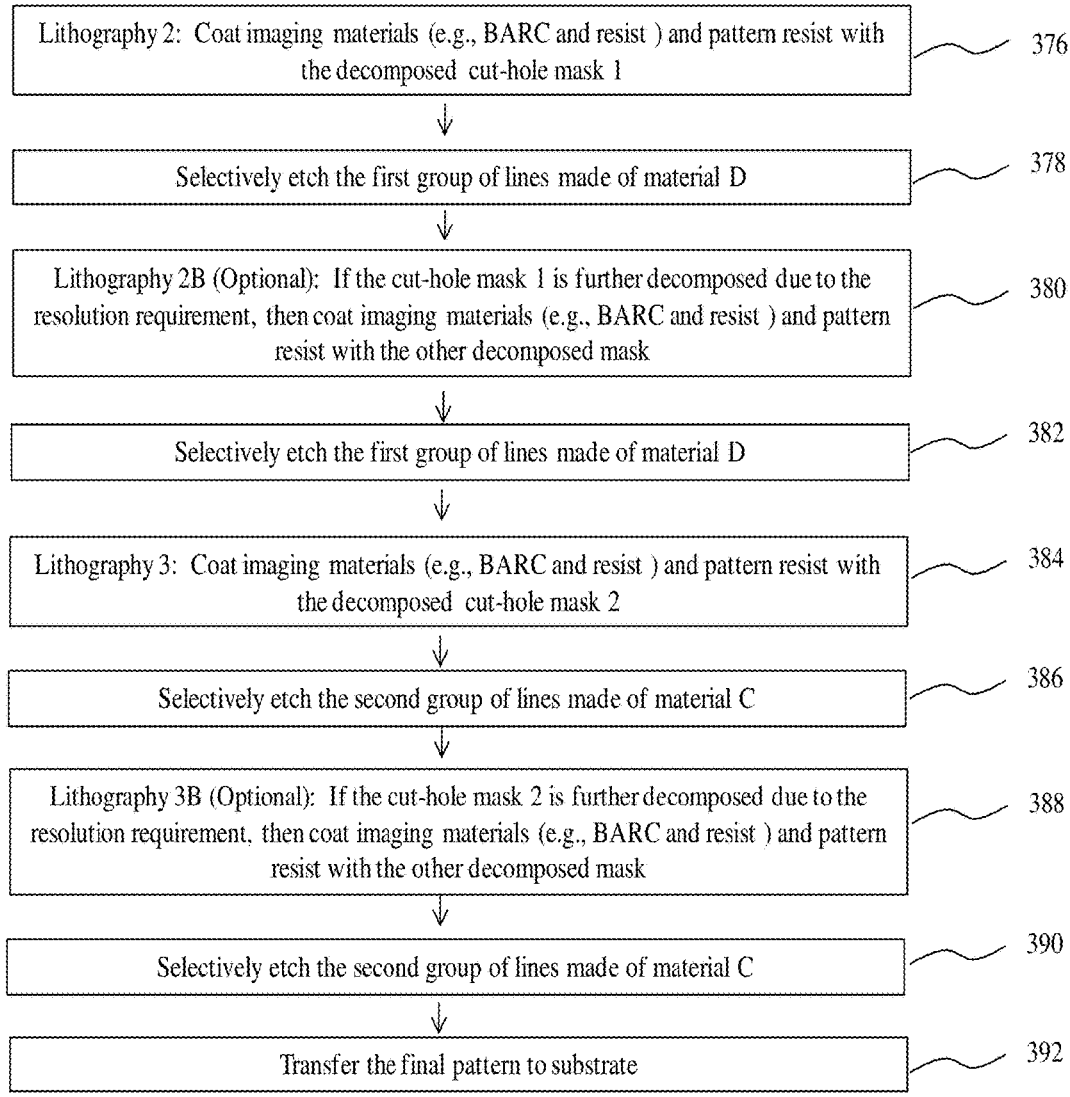

FIG. 11 is a flowchart depicting the processing steps associated with the dmSAQP process described by FIG. 6 and the cut-hole layout treatment illuminated by FIGS. 8 and 9, respectively.

Figure 12:
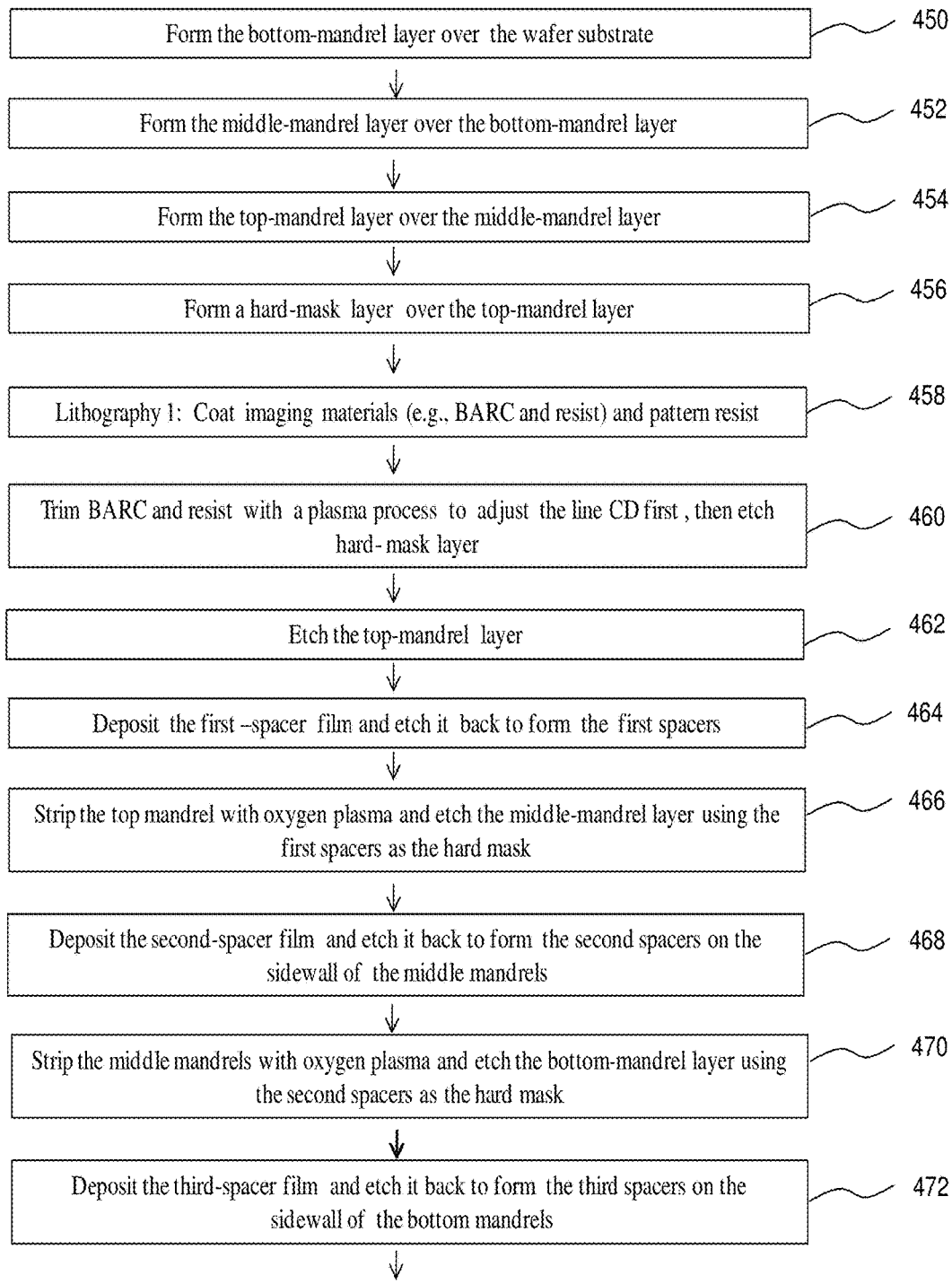
Figure 12:
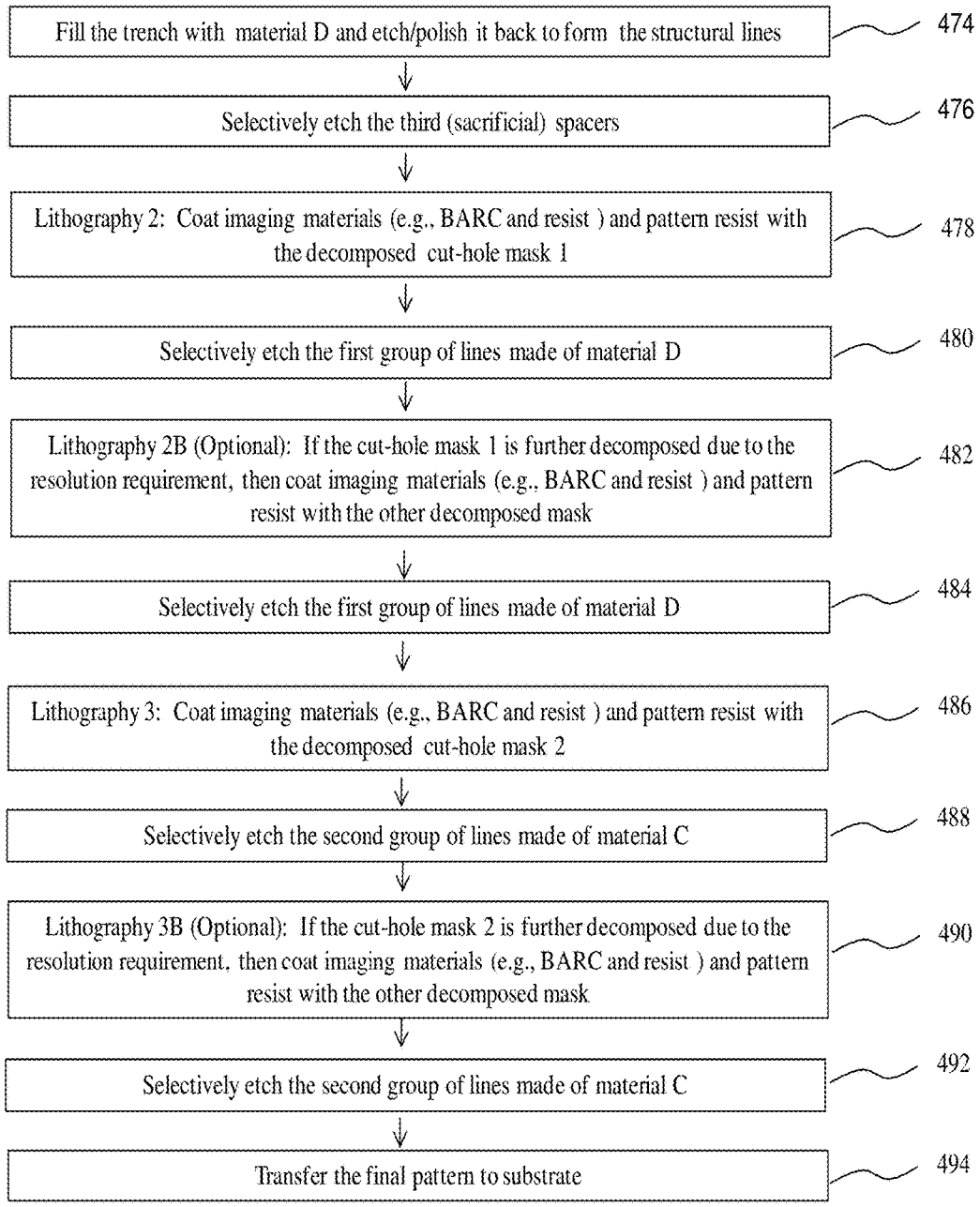

FIG. 12 is a flowchart depicting the processing steps associated with the dmSAOP process described by FIG. 7 and the cut-hole layout treatment illuminated by FIGS. 8 and 9, respectively.

DETAILED DESCRIPTION OF THE INVENTION

Figure 6A:
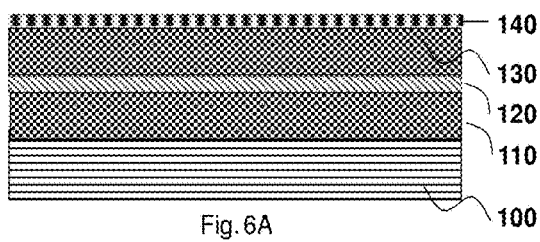
Figure 6B:
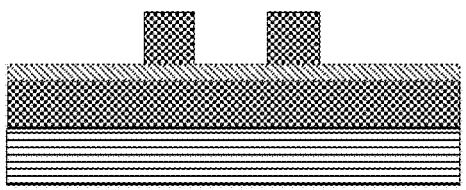
Figure 6C:
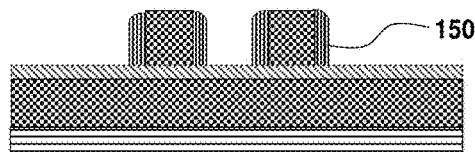
Figure 6D:
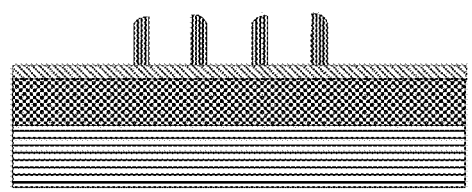
Figure 6E:
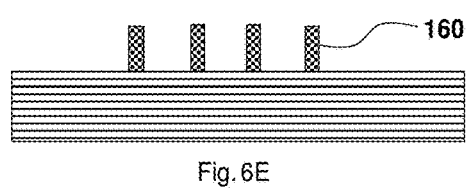
Figure 6F:
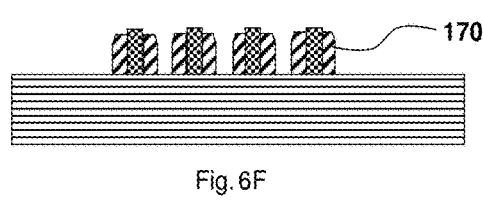
Figure 6G:
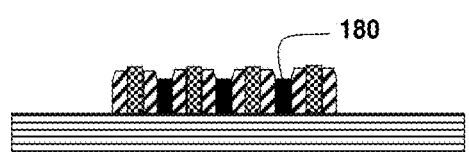
Figure 6H:
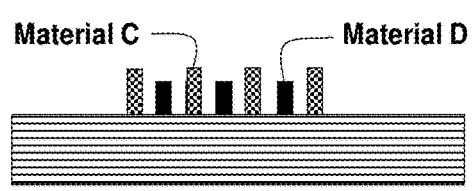

To better understand the invention, a flowchart is shown in FIG. 11 to depict the steps associated with a dual-material self-aligned quadruple patterning (dmSAQP) process which produces a line array made of two different materials. The corresponding cross-sectional views cutting through the array structure is shown FIG. 6 to illustrate the process details in above flowchart. The fabrication method starts by forming a stack of layers (110-140) on a substrate 100 shown in FIG. 6A, and indicated by operations 350-356 shown in FIG. 11. This step includes forming a bottom-mandrel layer (350) and correspondingly a thin hard-mask layer (352) over the bottom-mandrel layer, a top-mandrel layer (354) and correspondingly a thin hard-mask layer (356) over the top-mandrel layer. The possible choices of the mandrel material include (but not limited to): amorphous carbon (formed either by a chemical-vapor deposition or by a spin-on process, normally requiring a nitride or oxide hard mask on the top) which can be etched by oxygen plasma, photo-sensitive imaging materials such as a combination of photoresist and BARC (bottom anti-reflective coating) that can be etched by oxygen plasma, silicon oxide that can be wet etched by HF solution, silicon nitride that can be wet etched by phosphoric acid, polycrystalline Si (poly-Si) that can be wet etched by KOH solution, or Ge (or SiGe with low Ge content) that can be wet etched by hot H2O2 solution. The film stack is patterned by lithography (operation 358) and the half pitch of patterned features is defined by the minimum resolution of the lithographic tool. The formed patterns on resist are trimmed and transferred to the top hard-mask layer first (operation 360) and then etched into the top mandrel layer (operation 362, as shown in FIG. 6B). A chemical vapor deposition (CVD) of the spacer material is carried out on top of the mandrel patterns and etched back to form the spacers on the sidewalls of the mandrels (operation 364), as shown in FIG. 6C. The mandrels are then stripped by an oxygen plasma process without attacking the spacers (operation 366), as shown in FIG. 6D. These spacer patterns (150) are first transferred to the bottom hard-mask layer and then etched into the bottom mandrel layer to form the bottom-mandrel patterns (160) (operation 368, also shown in FIG. 6E). The second spacers (sacrificial spacers, 170) are formed on the sidewalls of the bottom mandrels (operation 370, also shown in FIG. 6F) followed by a trench-fill process (operation 372) to form the structural features in the trench (180). The material of these filled-in features should be different from that of the bottom mandrels (160) and allows a highly selective etching process described before. This trench-fill process can be a combination of a CVD or a spin-on process with an etching-back or a CMP (chemical mechanical polishing) process. The sacrificial spacers (170) are etched using oxygen plasma process (operation 376), leaving the bottom mandrels (160) and filled-in features (180) and resulting in spatial frequency quadrupling as shown in FIG. 6H. Separate patterning steps using the decomposed cut-hole masks are then carried out to form cut holes on top of the targeted lines, followed by a selective etching process to cut the targeted lines apart, as shown by operations 376-390 in FIG. 11.

Figure 7A:
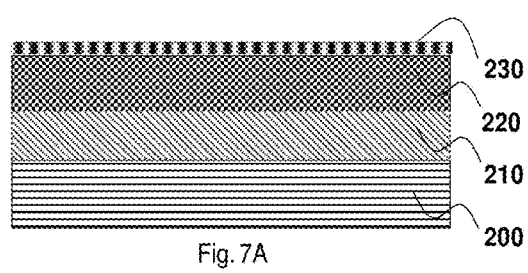
Figure 7B:
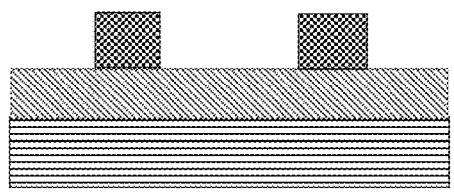
Figure 7C:
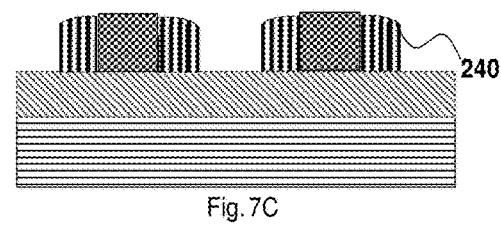
Figure 7D:
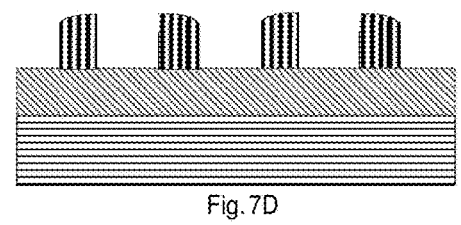
Figure 7E:
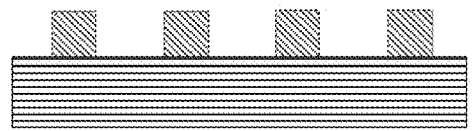
Figure 7F:
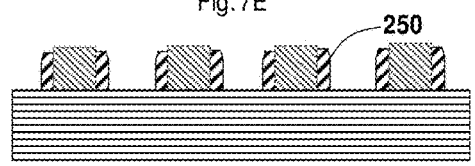
Figure 7G:
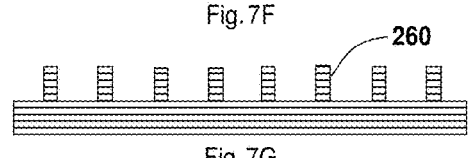
Figure 7H:
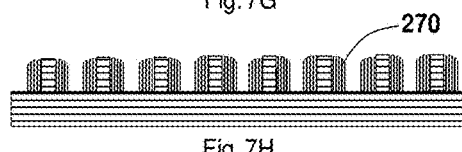
Figure 7I:
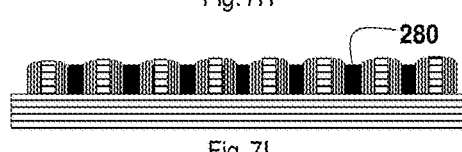
Figure 7J:
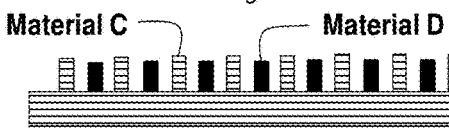

Another flowchart is shown in FIG. 12 to depict the steps associated with a dmSAOP process. The corresponding cross-sectional views cutting through the array structure (lines/spaces) are shown in FIG. 7 to illustrate the process details of the steps in above flowchart. As shown in FIG. 7A and indicated by operations 450-456 in FIG. 12, this method starts by forming a stack of layers (200-230) on the wafer substrate, i.e., forming a bottom-mandrel layer (200), a middle-mandrel layer (210), a top-mandrel layer (220), and a thin hard-mask layer (230) over the top-mandrel layer. The possible choices of the mandrel material include (but not limited to): amorphous carbon (formed either by a chemical-vapor deposition or by a spin-on process, normally requiring a nitride or oxide hard mask on the top), photo-sensitive imaging materials such as a combination of photoresist and BARC (bottom anti-reflective coating), silicon oxide, silicon nitride, polycrystalline Si (poly-Si), or Ge (or SiGe with low Ge content). The film stack is patterned by lithography (operation 458) and the formed patterns on resist are trimmed to meet the desired CD specification. After the trimming step, the resist patterns are transferred to the hard-mask layer first (operation 460) and then etched into the top mandrel layer (operation 462, as shown in FIG. 7B). A chemical vapor deposition (CVD) of a thin film is carried out and etched back to form the first spacers (240) on the sidewalls of the top mandrels (operation 464), as shown in FIG. 7C. The top mandrels are then stripped by an oxygen plasma process (without attacking the spacers) and the left spacer patterns are transferred to the middle-mandrel layer (operation 466), as shown in FIGS. 7D-7E. Similar to the previous spacer-forming steps, the second spacers (250) are formed on the sidewalls of the middle mandrels (operation 468, also shown in FIG. 7F). The middle mandrels are then stripped by an oxygen plasma process and the left spacer patterns are transferred to the bottom-mandrel layer (operation 470), as shown in FIG. 7G. The bottom-mandrel features (260) are then coated with a thin film by a CVD process and etched back to form the third spacers (270), as depicted by operation 472 in FIG. 12. Finally, a trench-fill process will be applied to form the structural features (280) in the trench (operation 474). The material of these filled-in features should be different from that of the bottom mandrels (260) and allows a highly selective etching process. This trench-fill process can be a combination of a CVD or a spin-on process with an etching-back or a CMP (chemical mechanical polishing) process. The sacrificial spacers (270) are etched using oxygen plasma (operation 476), leaving the bottom mandrels (260) and filled-in features (280) and resulting in spatial frequency octupling as shown in FIG. 7J. Separate patterning steps using the decomposed cut-hole masks are then carried out to form cut holes on top of the targeted lines, followed by a selective etching process to cut the targeted lines apart, as shown by operations 478-492 in FIG. 12.

The invention claimed is:

1. A method to reduce the effect of edge-placement errors using dual-material self-aligned quadruple patterning (dm-SAQP) and selective etching processes comprising:
   a bottom-mandrel layer formed over a wafer substrate;
   a first hard-mask layer formed over the bottom-mandrel layer;
   a top-mandrel layer formed over the first hard-mask layer;
   a second hard-mask layer formed over the top-mandrel layer;
   coating a first thin film of bottom anti-reflective coating (BARC) and then a first thin film of resist;
   a lithographic step to pattern the first thin film of resist coated on the wafer substrate;
   trimming the first thin film of resist and the first thin film of BARC to tune a feature Critical-Dimension (CD);
   etching the second hard-mask layer and using it as a hard mask for the following etching;
   etching the top-mandrel layer and stripping the second hard-mask layer residue;
   depositing a first CVD layer over the top-mandrel layer;
   etching the first CVD layer to form first spacers on sidewalls of the top-mandrel layer;
   using oxygen plasma process to strip the top-mandrel layer;
   etching the bottom hard-mask layer and using it as a hard mask for the following etching;
   etching the bottom-mandrel layer and stripping the bottom hard-mask layer residue;
   depositing a second CVD layer over the bottom-mandrel layer;
   etching the second CVD layer to form second spacers on sidewalls of the bottom mandrel layer;
   filling trenches formed by the second spacers with a material different from that of the bottom-mandrel layer to form filled-in features;
   partially etching or polishing back the filled-in material to expose the second spacers;
   etching the second spacers without attacking the bottom-mandrel layer and the filled-in features;
   coating a second thin film of BARC and then a second thin film of resist;
   a lithographic step to pattern cut-hole features on the second thin film of resist using one decomposed cut mask which only expose those lines to be etched;
   etching one group of lines that are exposed and made of the same material;
   coating a third thin film of BARC and then a third thin film of resist;
   a lithographic step to pattern cut-hole features on the third thin film of resist using the other decomposed cut mask which only expose those lines to be etched in the following etching process;
   etching the other group of lines that are exposed and made of a different material;
   etching to transfer the final pattern to the wafer substrate.

2. A method to reduce the effect of edge-placement errors using dual-material self-aligned octuple patterning (dm-SAOP) and selective etching processes comprising:
   a bottom-mandrel layer formed over a wafer substrate;
   a middle-mandrel layer formed over the bottom-mandrel layer;
   a top-mandrel layer formed over the middle-mandrel layer;
   a top hard-mask layer formed over the top-mandrel layer;
   coating a first thin film of Bottom Anti-Reflective Coating (BARC) and then a first thin film of resist;
   a lithographic step to pattern the first thin film of resist coated on the wafer substrate;
   trimming the first thin film of resist and the first thin film of BARC to tune a feature Critical-Dimension (CD);
   etching the top hard-mask layer and using it as a hard mask to etch the top-mandrel layer;
   stripping the top hard-mask residue;
   depositing a first CVD layer over the top-mandrel layer;
   etching the first CVD layer to form first spacers on sidewalls of the top-mandrel layer;
   using oxygen plasma process to strip the top-mandrel layer;
   etching the middle-mandrel layer using the first spacers as a hard mask;
   depositing a second CVD layer over the middle-mandrel layer;
   etching the second CVD layer to form second spacers on sidewalls of the middle-mandrel layer;
   using oxygen plasma process to strip the middle-mandrel layer;
   etching the bottom-mandrel layer using the second spacers as a hard mask;
   depositing a third CVD layer over the bottom-mandrel layer;
   etching the third CVD layer to form third spacers on sidewalls of the bottom mandrel layer;
   filling trenches formed by the third spacers with a material different from that of the bottom-mandrel layer to form filled-in features;
   partially etching or polishing back the filled-in material to expose the third spacers;
   etching the third spacers without attacking the bottom-mandrel layer and the filled-in features;
   coating a second thin film of BARC and then a second thin film of resist;
   a lithographic step to pattern cut-hole features on the second thin film of resist using one decomposed cut mask which only expose those lines to be etched;
   etching one group of lines that are exposed and made of the same material;

coating a third thin film of BARC and then a third thin film of resist;

a lithographic step to pattern cut-hole features on the third thin film of resist using the other decomposed cut mask which only expose those lines to be etched in the following etching process;

etching the other group of lines that are exposed and made of a different material;

etching to transfer the final pattern to the wafer substrate.

3. The method of claim 1 wherein all the mandrel layers are made of amorphous carbon.

4. The method of claim 1 wherein the bottom-mandrel layer are made of silicon nitride.

5. The method of claim 1 wherein the bottom-mandrel layer are made of silicon oxide.

6. The method of claim 1 wherein the bottom-mandrel layer are made of amorphous carbon while the top-mandrel and top-hard-mask layers are replaced by a stack of resist and BARC.

7. The method of claim 1 wherein the first CVD layer material deposited over the top-mandrel layer is silicon oxide.

8. The method of claim 1 wherein the first CVD layer material deposited over the top-mandrel layer is silicon nitride.

9. The method of claim 1 wherein the second CVD layer material deposited over the bottom-mandrel layer is silicon.

10. The method of claim 1 wherein the second CVD layer material deposited over the bottom-mandrel layer is SiGe.

11. The method of claim 1 wherein the second CVD layer material deposited over the bottom-mandrel layer is Ge.

12. The method of claim 1 wherein the filled-in material is TiN.

13. The method of claim 1 wherein the filled-in material is Cobalt.

14. The method of claim 1 wherein the filled-in material is amorphous carbon.

15. The method of claim 1 wherein the filled-in material is silicon nitride.

16. The method of claim 1 wherein the filled-in material is silicon oxide.

17. The method of claim 1 wherein the second hard-mask layer is silicon nitride.

18. The method of claim 1 wherein the second hard-mask layer is silicon oxide.

19. The method of claim 1 wherein the first hard-mask layer is silicon oxide.

20. The method of claim 1 wherein the first hard-mask layer is silicon nitride.

21. The method of claim 2 wherein all the mandrel layers are made of amorphous carbon.

22. The method of claim 2 wherein the bottom-mandrel layer is made of silicon nitride.

23. The method of claim 2 wherein the bottom-mandrel layer is made of silicon oxide.

24. The method of claim 2 wherein the bottom and middle mandrel layers are made of amorphous carbon while the top-mandrel and top-hard-mask layers are replaced by a stack of resist and BARC.

25. The method of claim 2 wherein the first CVD layer material deposited over the top-mandrel layer is silicon oxide.

26. The method of claim 2 wherein the first CVD layer material deposited over the top-mandrel layer is silicon nitride.

27. The method of claim 2 wherein the second CVD layer material deposited over the middle-mandrel layer is silicon oxide.

28. The method of claim 2 wherein the second CVD layer material deposited over the middle-mandrel layer is silicon nitride.

29. The method of claim 2 wherein the third CVD layer material deposited over the bottom-mandrel layer is silicon.

30. The method of claim 2 wherein the third CVD layer material deposited over the bottom-mandrel layer is SiGe.

31. The method of claim 2 wherein the filled-in material is TiN.

32. The method of claim 2 wherein the filled-in material is Cobalt.

33. The method of claim 2 wherein the filled-in material is amorphous carbon.

34. The method of claim 2 wherein the filled-in material is silicon nitride.

35. The method of claim 2 wherein the filled-in material is silicon oxide.

36. The method of claim 2 wherein the top hard-mask layer is silicon nitride.

37. The method of claim 2 wherein the top hard-mask layer is silicon oxide.

* * * * *